United States Patent
Kang

(10) Patent No.: US 7,932,547 B2
(45) Date of Patent: Apr. 26, 2011

(54) NONVOLATILE FERROELECTRIC MEMORY DEVICE USING SILICON SUBSTRATE, METHOD FOR MANUFACTURING THE SAME, AND REFRESH METHOD THEREOF

(75) Inventor: Hee Bok Kang, Cheongju-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 135 days.

(21) Appl. No.: 11/715,880

(22) Filed: Mar. 9, 2007

(65) Prior Publication Data

US 2008/0023741 A1    Jan. 31, 2008

(30) Foreign Application Priority Data

Jul. 27, 2006  (KR) .................. 10-2006-0070963
Dec. 22, 2006  (KR) .................. 10-2006-0132602

(51) Int. Cl.
*H01L 21/02* (2006.01)

(52) U.S. Cl. . 257/295; 257/314; 257/315; 257/E21.436; 257/E21.663; 257/E27.104; 257/E29.272

(58) Field of Classification Search .................. 257/295, 257/E27.104, E29.164, E29.272
See application file for complete search history.

(56) References Cited

U.S. PATENT DOCUMENTS

| 5,723,885 | A  | * | 3/1998  | Ooishi ........................ 257/295 |
| 6,054,734 | A  | * | 4/2000  | Aozasa et al. ................ 257/315 |
| 6,448,115 | B1 |   | 9/2002  | Bae |
| 6,532,165 | B1 | * | 3/2003  | Katori ........................ 365/145 |
| 6,775,172 | B2 |   | 8/2004  | Kang et al. |
| 6,980,461 | B2 |   | 12/2005 | Portmann et al. |

FOREIGN PATENT DOCUMENTS

| JP | 09-116036      | 5/1997  |
| JP | 2002-343886    | 11/2002 |
| KR | 10-2006-0076003 | 7/2006 |

* cited by examiner

Primary Examiner — Lynne A Gurley
Assistant Examiner — Jesse Y Miyoshi
(74) *Attorney, Agent, or Firm* — IP & T Group LLP

(57) ABSTRACT

A nonvolatile ferroelectric memory device using a silicon substrate includes an insulating layer formed in an etching region of the silicon substrate, a bottom word line formed in the insulating layer so as to be enclosed by the insulating layer, a floating channel layer formed over the bottom word line, an impurity layer formed at both ends of the floating channel layer and including a source region formed over the insulating layer and a drain region formed over the silicon substrate, a ferroelectric layer formed over the floating channel layer, and a word line formed over the ferroelectric layer.

10 Claims, 20 Drawing Sheets

NONVOLATILE FERROELECTRIC MEMORY DEVICE USING SILICON SUBSTRATE, METHOD FOR MANUFACTURING THE SAME, AND REFRESH METHOD THEREOF

CROSS-REFERENCES TO RELATED APPLICATIONS

The present application claims the benefit of priority of Korean Patent Application Nos. 10-2006-0070963 filed on Jul. 27, 2006, and 10-2006-0132602 filed on Dec. 22, 2006, which is incorporated by reference in its entirety. Moreover, the present application is related to U.S. Pat. Nos. 6,775,172, and 6,980,461, the contents of which are also incorporated herein by reference in their entirety.

BACKGROUND

The present invention generally relates to a nonvolatile ferroelectric memory device using a silicon substrate, a method for manufacturing the same, and a refresh method thereof, and more specifically, to a technology of providing a double gate one transistor (1T) capacitorless type nonvolatile ferroelectric memory device using a bulk-silicon substrate.

In general, a DRAM requires a continuous power supply to store data as a volatile memory. When a power is not supplied, data of a RAM may be destroyed because a memory cell of the DRAM is designed to have small capacitors for keeping the charged power and for retaining the data. If these capacitors are not recharged, the capacitor loses the previously charged power, thus losing the data.

A refresh operation refers to a recharging process of a memory cell in a memory chip. Memory cells in a row can be charged in each refresh cycle. Although the refresh operation is performed by memory control of the system, some chips are designed to perform a self-refresh operation.

For example, there is disclosed a DRAM chip, which has a self-refresh circuit configured to perform a self-refresh operation without a Central Processing Unit (CPU) or an external refresh circuit. The self-refresh method has been frequently used in portable computers to reduce power consumption.

In the conventional volatile DRAM having a short refresh cycle, the refresh operation is frequently performed, which results in large power consumption and degradation of operation performance.

As an example of these integrated circuits, a nonvolatile ferroelectric memory, such as a Ferroelectric Random Access Memory (FeRAM) device, has attracted considerable attention as next generation memory device because it has a data processing speed as fast as a Dynamic Random Access Memory (DRAM) and conserves data even after the power is turned off.

An FeRAM having a structure similar to that of a DRAM includes capacitors made of a ferroelectric substance, which has a high residual polarization allowing for retention of data after power is turned off.

A One-Transistor One-Capacitor (1T1C) type unit cell of the conventional FeRAM includes one switching element configured to perform a switching operation depending on a state of a word line so as to connect a nonvolatile ferroelectric capacitor to a bit line, and one nonvolatile ferroelectric capacitor connected between a plate line and one end of the switching element. The switching element of the conventional FeRAM is an NMOS transistor whose switching operation is controlled by a gate control signal.

SUMMARY

Various embodiments consistent with the present invention are directed at providing a double gate one transistor field effect transistor (1T-FET) type nonvolatile ferroelectric memory cell using a bulk-silicon substrate.

Various embodiments consistent with the present invention are directed at preserving data of a nonvolatile FeRAM device when a power source is off and performing a refresh operation in a given cycle to restore degraded cell data, thereby improving data retention characteristics. Unlike DRAMs, the nonvolatile FeRAM device is configured to have the whole data retention time including the on/off time of the power source so as not to perform a refresh operation frequently, thereby reducing power consumption and improving operation performance.

According to an embodiment consistent with the present invention, a nonvolatile ferroelectric memory device using a silicon substrate comprises an insulating layer formed in an etching region of the silicon substrate, a bottom word line formed in the insulating layer so as to be enclosed by the insulating layer, a floating channel layer formed over the bottom word line, an impurity layer formed at both ends of the floating channel layer and including a source region formed over the insulating layer and a drain region formed over the silicon substrate, a ferroelectric layer formed over the floating channel layer, and a word line formed over the ferroelectric layer.

According to an embodiment consistent with the present invention, a nonvolatile ferroelectric memory device using a silicon substrate comprises a memory cell, a register configured to store information of the memory cell, and a refresh control unit configured to perform a refresh operation with a given refresh cycle so as to improve retention characteristics of data stored in the memory cell. The memory cell comprises a silicon substrate, a ferroelectric layer formed over the floating channel layer, and a word line formed over the ferroelectric layer. The silicon substrate includes a bottom word line, a floating channel layer formed over the bottom word line, and drain/source regions formed at both ends of the floating channel layer. The memory cell is configured to induce a different channel resistance to a channel region of the floating channel layer depending on a polarity state of the ferroelectric layer so as to read/write data.

According to an embodiment consistent with the present invention, a nonvolatile ferroelectric memory device using a silicon substrate comprises a cell array including a plurality of nonvolatile memory cells each being configured to read/write data, a refresh control unit configured to control a refresh operation in a given cycle in response to a refresh control signal for improving retention characteristics of data stored in the memory cell so as to output a count address for refresh operations, a row address control unit configured to latch and decode a row address in response to a RAS signal and an output signal from the refresh control unit and to select the count address in the refresh mode, a column address control unit configured to latch and decode a column address in response to a CAS signal, and an input/output logic circuit configured to control read/write operations of the cell array in response to an output enable signal and read/write commands. The cell array comprises an insulating layer formed in an etching region of the silicon substrate, a bottom word line in the insulating layer so as to be enclosed by the insulating layer, a floating channel layer formed over the bottom word line, an impurity layer formed at both ends of the floating channel layer and including a source region formed over the insulating layer and a drain region formed over the silicon substrate, a ferroelectric layer formed over the floating channel layer, and a word line formed over the ferroelectric layer.

Consistent with the present invention, there is also provided a method for refreshing a nonvolatile ferroelectric memory device using a silicon substrate that comprises a double gate 1T-FET type memory cell includes the steps of: reading/writing data in the memory cell; and refreshing data of the memory cell so as to improve retention characteristics of data stored in the memory cell. The memory cell comprises a silicon substrate, a ferroelectric layer formed over the floating channel layer, and a word line formed over the ferroelectric layer. The silicon substrate includes a bottom word line, a floating channel layer formed over the bottom word line and drain/source regions formed at both ends of the floating channel layer. The memory cell is configured to induce a different channel resistance to a channel region of the floating channel layer depending on a polarity state of the ferroelectric layer so as to read/write data.

Further consistent with the present invention, there is also provided a method for manufacturing a nonvolatile ferroelectric memory device using a silicon substrate comprises the steps of: etching a silicon substrate to have a T shape with an etching mask formed over the silicon substrate to form a plurality of T-shaped silicons spaced with a given interval; forming a first insulating layer having a given thickness over the resulting structure including the plurality of T-shaped silicons, and filling bottom word lines each having a given thickness at both ends of an etching region between the plurality of T-shaped silicons; performing a gap-fill process on the resulting structure to fill a second insulating layer, and etching the first insulating layer and the second insulating layer that cover the top portions of the plurality of T-shaped silicons; filling a silicon in the etching region between the plurality of T-shaped silicons to grow crystallization; sequentially forming a ferroelectric layer and a word line over the resulting structure, and etching the ferroelectric layer and the word line; ion-implanting impurities into the plurality of T-shaped silicons and the silicon to form drain/source regions, and forming a floating channel layer separated from the drain/source regions; and forming a sensing line and a bit line over the impurities.

DETAILED DESCRIPTION

The present invention will be described in detail with reference to the accompanying drawings.

Figure 1:
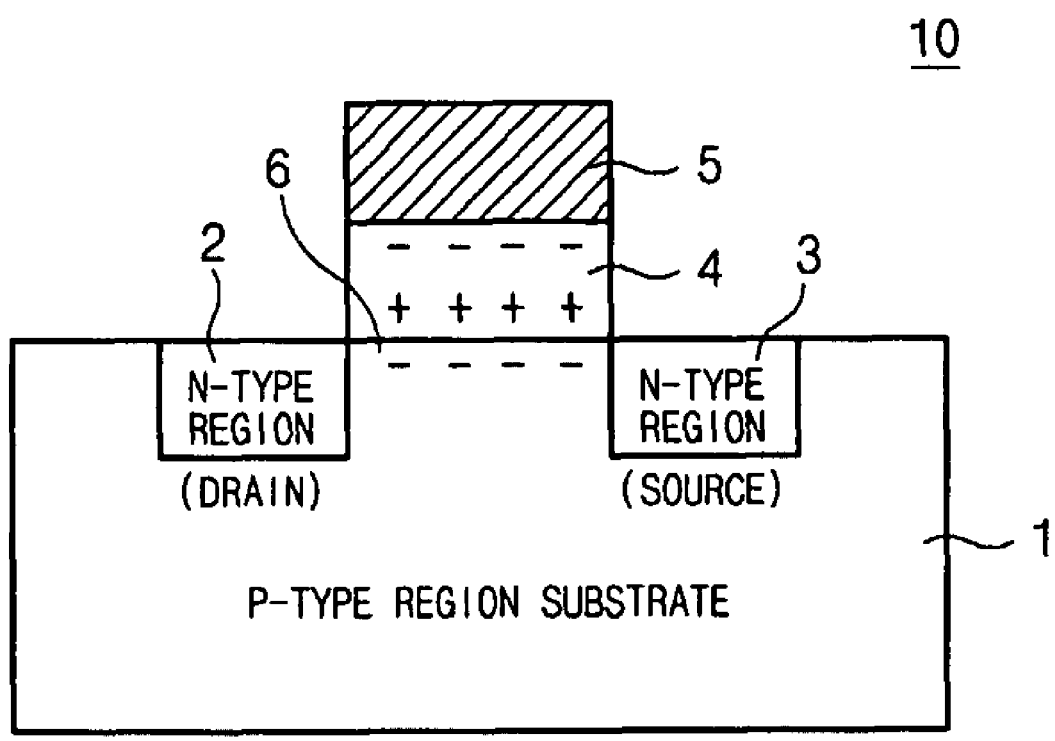
FIG. 1 is a cross-sectional diagram illustrating a cell of a conventional nonvolatile ferroelectric memory device.
Figure 2:
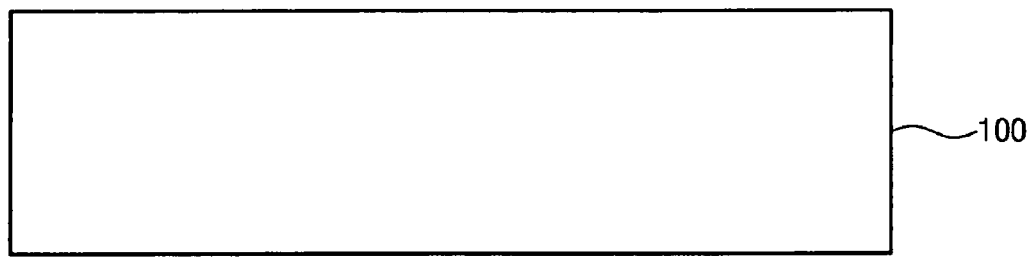
FIGS. 2 through 14 are cross-sectional diagrams illustrating a method for manufacturing a nonvolatile ferroelectric memory device using a silicon substrate according to an embodiment consistent with the present invention.
Figure 3:
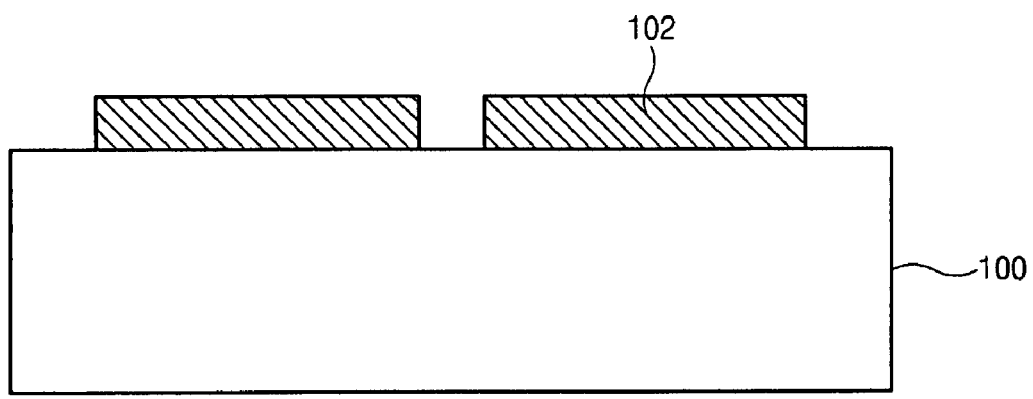
Figure 4:
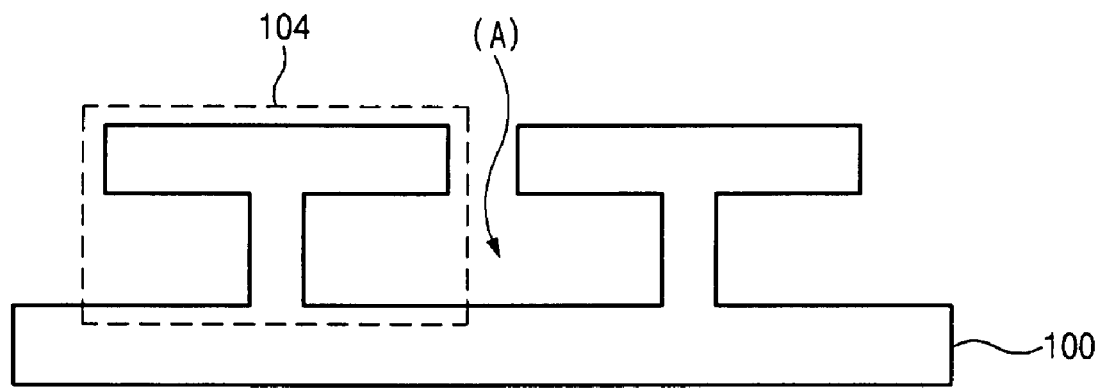
Figure 5:
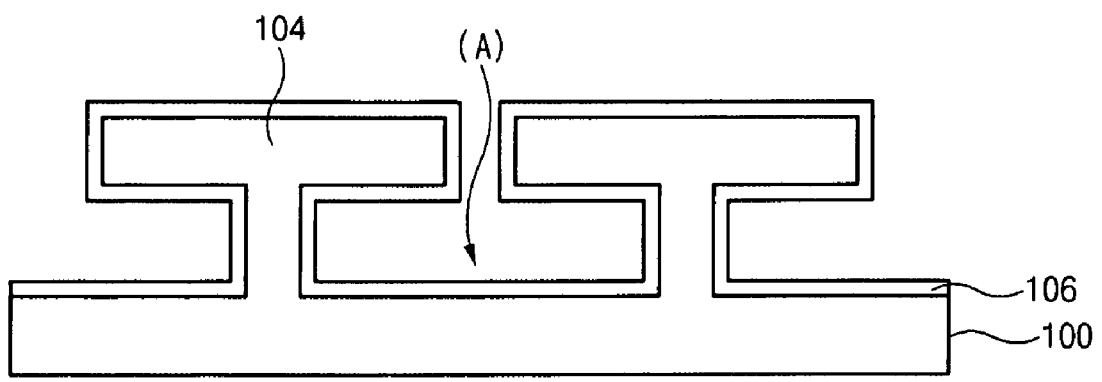
Figure 6:
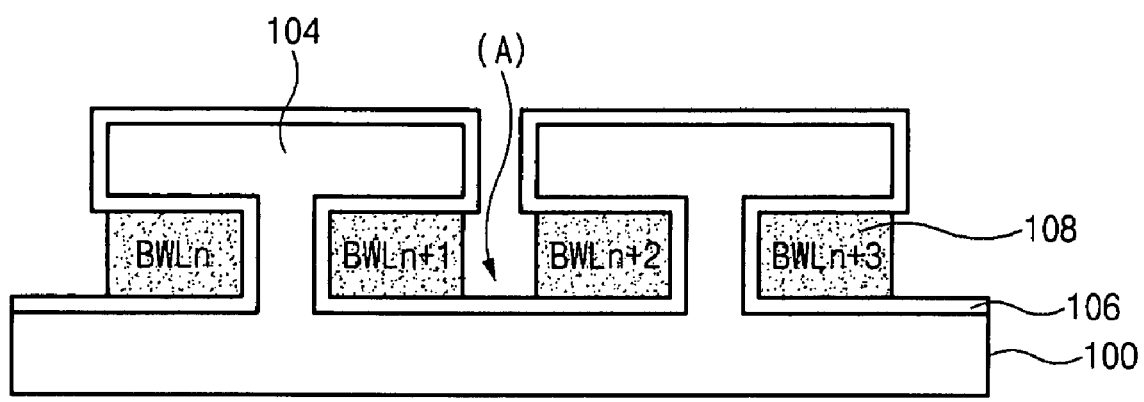
Figure 7:
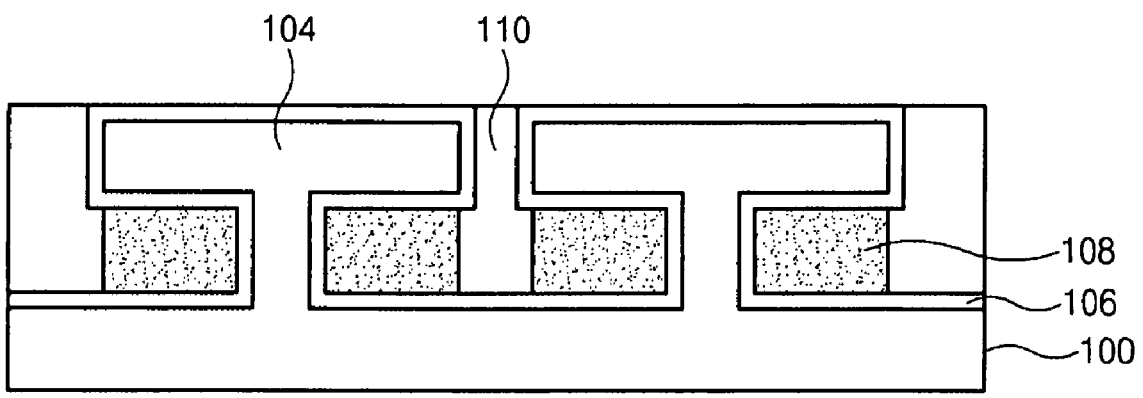
Figure 8:
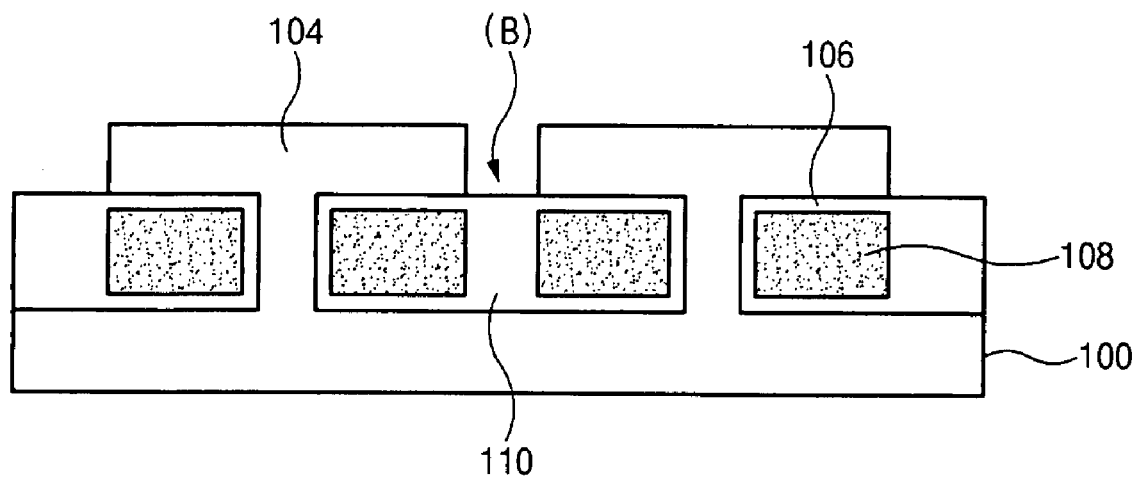
Figure 9:
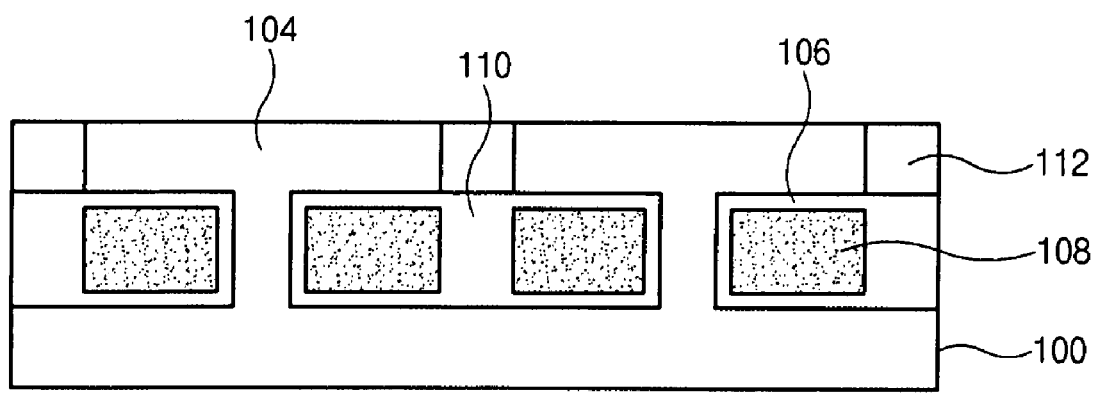
Figure 10:
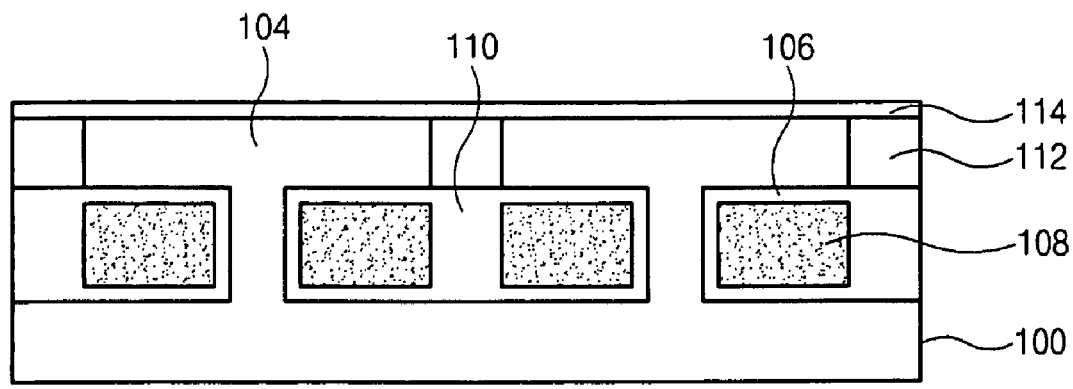
Figure 11:
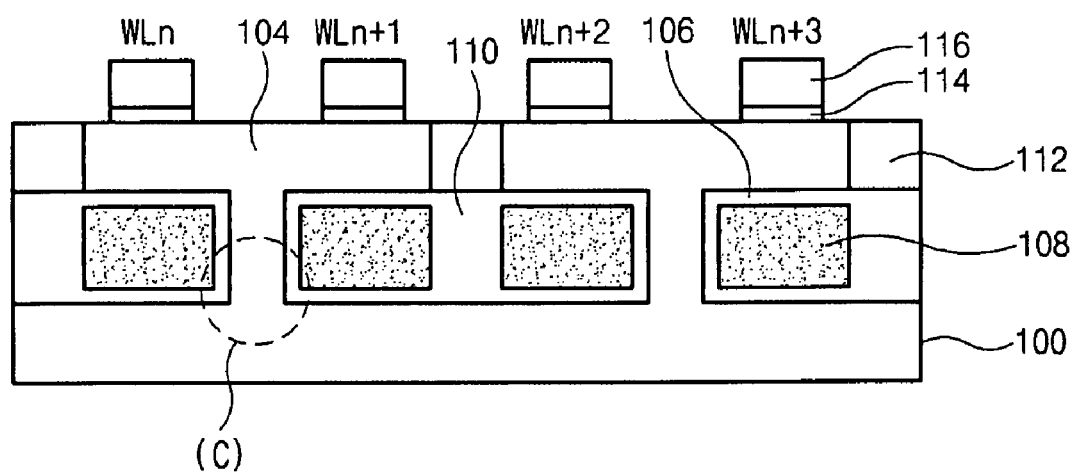
Figure 12:
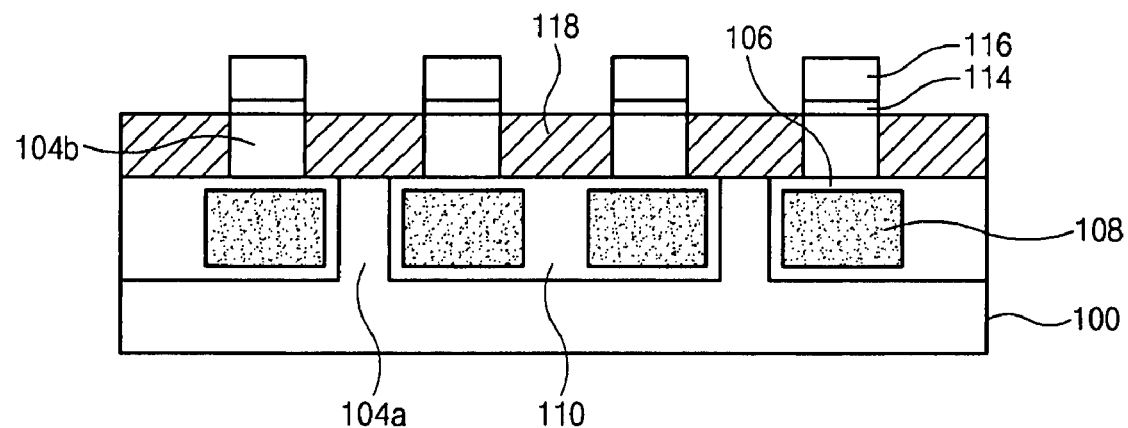
Figure 13:
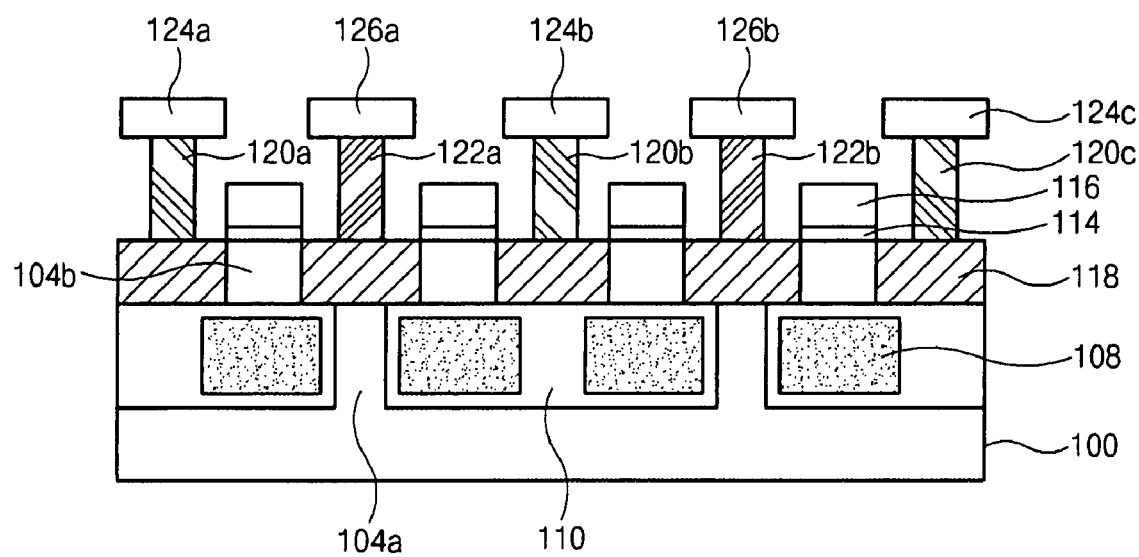

FIG. 1 is a cross-sectional diagram illustrating a cell of a conventional nonvolatile ferroelectric memory device.

A conventional One-Transistor Field Effect Transistor (1-T FET) type memory cell 10 may include a P-type channel region 6, an N-type drain region 2, and a N-type source region 3 over a P-type region substrate 1. A ferroelectric layer 4 may be formed over channel region 6, and a word line 5 may be formed over ferroelectric layer 4.

Data may be read/written by a channel resistance of memory cell 10. The channel resistance may be differentiated depending on polarization states of ferroelectric layer 4.

When the polarity of ferroelectric layer 4 induces positive charges to channel region 6, memory cell 10 becomes at a high resistance channel state, and the channel is turned off. On the other hand, when the polarity of ferroelectric layer 4 induces negative charges to channel region 6, memory cell 10 becomes at a low resistance channel state, and the channel is turned on. In this way, the conventional nonvolatile FeRAM device may select polarization kinds of ferroelectric layer 4 to write data in memory cell 10, which becomes a nonvolatile memory cell.

However, a memory cell of the conventional 1T-FET type ferroelectric memory device is formed in a Silicon On Insulator (SOI) substrate which is expensive, thereby increasing the manufacturing cost of the memory cell.

Manufacturing processes of a 1T type memory cell using a SOI substrate is not interchangeable with that of a 1T1C type memory cell using a silicon substrate. That is, wafers, equipments, and processes used in the 1T type memory cell are different from those used in the 1T1C type memory cell. As a result, the 1T type memory cell using a SOI substrate requires additional set-ups for new wafers, equipments, and processes.

Although the 1T-FET type memory cell of the conventional FeRAM device has nonvolatile characteristics, cell data may be degraded as time passes, thereby limiting data retention life. As a result, data retention characteristics may be degraded, such that the best state of nonvolatile cell storage characteristics is not maintained.

FIGS. 2 through 14 are cross-sectional diagrams illustrating a method for manufacturing a nonvolatile ferroelectric memory device using a silicon substrate according to an embodiment consistent with the present invention.

A P-type substrate 100, which is a bare wafer, is formed. A T-shaped etching mask 102 is formed over P-type substrate 100. P-type substrate 100 for forming a T-shaped silicon structure includes bulk silicon.

P-type substrate 100 is etched to have a T shape with T-shaped etching mask 102 as an etching mask. As a result, a T-shaped silicon 104 is formed with a given interval over P-type substrate 100. A T-shaped etching region (A) having a reversed T-shape is formed between T-shaped silicons 104.

An insulating layer 106 is formed over the resulting structure including T-shaped silicon 104. Insulating layer 106 having a given thickness is formed to cover T-shaped silicon 104 and the top portion of P-type substrate 100.

A bottom word line 108 is formed at both ends of T-shaped etching region (A). Bottom word line 108 is filled in both ends of the bottom edge region of T-shaped silicon 104, and not in the middle region where T-shaped etching region (A) is exposed.

A gap-fill process for filling a space between bottom word lines 108 is performed on the resulting structure to form an insulating layer 110, which is filled in the middle region of T-shaped etching region (A). Insulating layer 110 may be formed to have the same height as that of insulating layer 106.

An etch-back process is performed on a portion of insulating layer 106 that covers the side surface and the top portion of T-shaped silicon 104. As a result, insulating layer 110 surrounds bottom word line 108 formed in the bottom edge region between adjacent T-shaped silicons 104. That is, insulating layer 110 is not filled in a top etching region (B) between adjacent T-shaped silicons 104.

A single crystal silicon 112 having the same height as that of top region (B) of T-shaped silicon 104 is filled in top etching region (B) between T-shaped silicons 104. Single crystal silicon 112 is filled and crystallized in top portion (B) of T-shaped silicon 104.

In one embodiment, T-shaped single crystal silicon 104 and silicon region 112 may be grown to form a single crystal so as to be interconnected. As a result, there is no space between T-shaped silicon 104 and silicon region 112 so that a floating channel region is sufficiently formed.

Although single crystal silicon 112 may be grown in region (B) between T-shaped silicons 104, in this embodiment, a poly crystalline silicon (not shown) may be filled in region (B) between T-shaped silicons 104 and thermally grown to be single-crystallized. The poly crystalline silicon may include amorphous silicon or poly silicon.

A ferroelectric layer 114 is formed over T-shaped silicon 104 and silicon region 112.

A word line 116 gate region is formed over ferroelectric layer 114. Ferroelectric layer 114 and word line 116 are selectively etched through an etching mask (not shown). As a result, a plurality of word lines 116 are spaced with a given interval over bottom word line 108. Word lines 116 are formed in a floating body region at both ends of T-shaped silicon 104, but not over a region (C) connected to T-shaped silicon 104 and P-type substrate 100.

An N+ layer 118, which is an impurity-implanting layer, is implanted into silicon region 110 and the top region of T-shaped silicon 104 to form floating channel layers 104b, which are spaced with a given interval. A channel region of floating channel layer 104b becomes floated, and the N+ layer 118 is not implanted into floating channel layer 104b. Floating channel layers 104b are formed in the top side of bottom word line 108 and in the bottom of ferroelectric layer 114. N+ layer 118 formed in both ends of floating channel layer 104b is used as drain/source regions.

A bulk connection silicon 104a is formed in a region where the top side of T-shaped silicon 104 implanted with N+ layer 118 is connected to P-type substrate 100. Bulk connection silicon 104a may have the same height as that of insulating layer 110. Floating channel layer 104b may be formed over a portion of bottom word line 108 where bulk connection silicon 104a is not formed.

N+ layer 118 is implanted into the top portion of bulk connection silicon 104a to electrically separate a bulk silicon from the source and drain ends. N+ layer 118 formed over the bulk connection silicon 104a may be used as source and drain regions. N+ layer 118 may be implanted into a filling layer of silicon 112 to form a source/drain end so that the floating body region may employ good silicon characteristics.

In one embodiment, sensing line contacts 120a~120c and bit line contacts 122a, 122b are formed to have a zigzag type arrangement with word lines 116 over N+ layer 118. In another embodiment, sensing line contacts 120a~120c and bit line contacts 122a, 122b formed over N+ layer 118 are formed alternately between word lines 116 by a line pattern process.

Sensing line contacts 120a~120c are formed over regions of insulating layer 110 where bulk connection silicon 104a is not formed. Bit line contacts 122a, 122b connected to the bit line are formed over the region of bulk connection silicon 104a.

Sensing lines 124a~124c are formed over sensing line contacts 120a~120c, respectively. Bit line contact pads 126a, 126b are formed over bit line contacts 122a, 122b, respectively.

Bit line contacts 128 are formed over bit line contact pads 126a, 126b, respectively. A bit line 130 having a bar type extended length is formed over bit line contacts 128.

In this embodiment, T-shaped silicon 104 may be formed from silicon substrate 100, bottom word line 108 may be formed in the bottom edge region of T-shaped silicon 104, and the 1T-FET type ferroelectric memory cell having a floating channel may be formed over silicon region 112.

An N-type semiconductor may be used as the drain/source regions, and a P-type semiconductor is used as the channel region of floating channel layer 104b. Alternatively, a P-type semiconductor may be used as the drain/source regions, and an N-type semiconductor is used as the channel region of floating channel layer 104b. The semiconductor of floating channel layer 104b may include a carbon nano tube, silicon, or germanium (Ge).

Consistent with an embodiment of the present invention, data is read/written according to a channel resistance of floating channel layer 104b, which is differentiated depending on polarization states of ferroelectric layer 114.

Suppose that the drain and source regions of floating channel layer 104b are formed to be N-type and the channel region is formed to be P-type. When ferroelectric layer 114 induces positive charges to the channel region of floating channel layer 104b, the memory cell transitions to a high resistance state so that the channel is turned off. On the other hand, when the polarity of ferroelectric layer 114 induces negative charges to the channel region, the memory cell transitions to a low resistance state so that the channel is turned on. In this way, polarization states of ferroelectric layer 114 are selected to write data in the cell. The cell thus become a nonvolatile memory cell.

Figure 15:
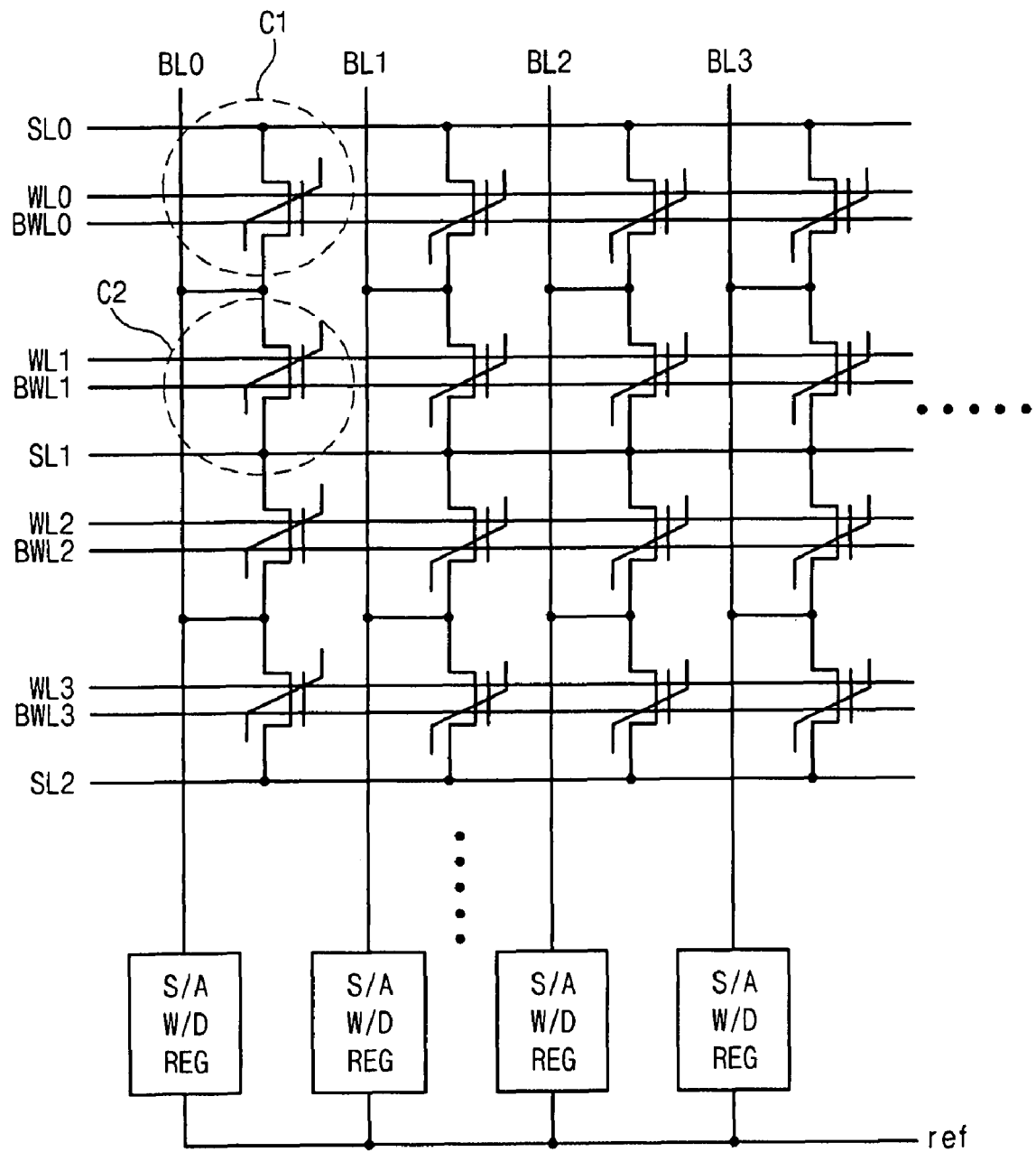
FIG. 15 is a cross-sectional diagram illustrating a cell array of a nonvolatile ferroelectric memory device using a silicon substrate according to an embodiment consistent with the present invention.

FIG. 15 is a cross-sectional diagram illustrating a cell array of a nonvolatile ferroelectric memory device using a silicon substrate according to an embodiment consistent with the present invention.

The cell array includes a plurality of word lines WL and a plurality of sensing lines SL. Word lines WL and sensing lines SL are arranged with a given interval in a row direction. A plurality of bit lines BL are arranged in a column direction so that bit lines BL are crossed with word lines WL and sensing lines SL. A plurality of unit cells C are formed where bit lines BL, word lines WL, and sensing lines SL are crossed.

Adjacent unit cells C1 and C2 have a common source connected to sensing line SL and a common drain connected to bit line BL. Gates of unit cells C1 and C2 are connected to word lines WL<0>, WL<1> and bottom word lines BWL<0>, BWL<1>.

A sense amplifier S/A senses and amplifies cell data to distinguish the data "1" from the data "0" so that sense amplifier S/A is connected to bit line BL. When data are written in the memory cell, a write driver W/D is configured to generate a driving voltage depending on write data so as to supply the driving voltage to bit line BL. Write driver W/D is connected to bit line BL. Register REG, which may serve as a temporary memory element for storing data of sense amplifier S/A temporarily, is connected to bit line BL.

Figure 16:
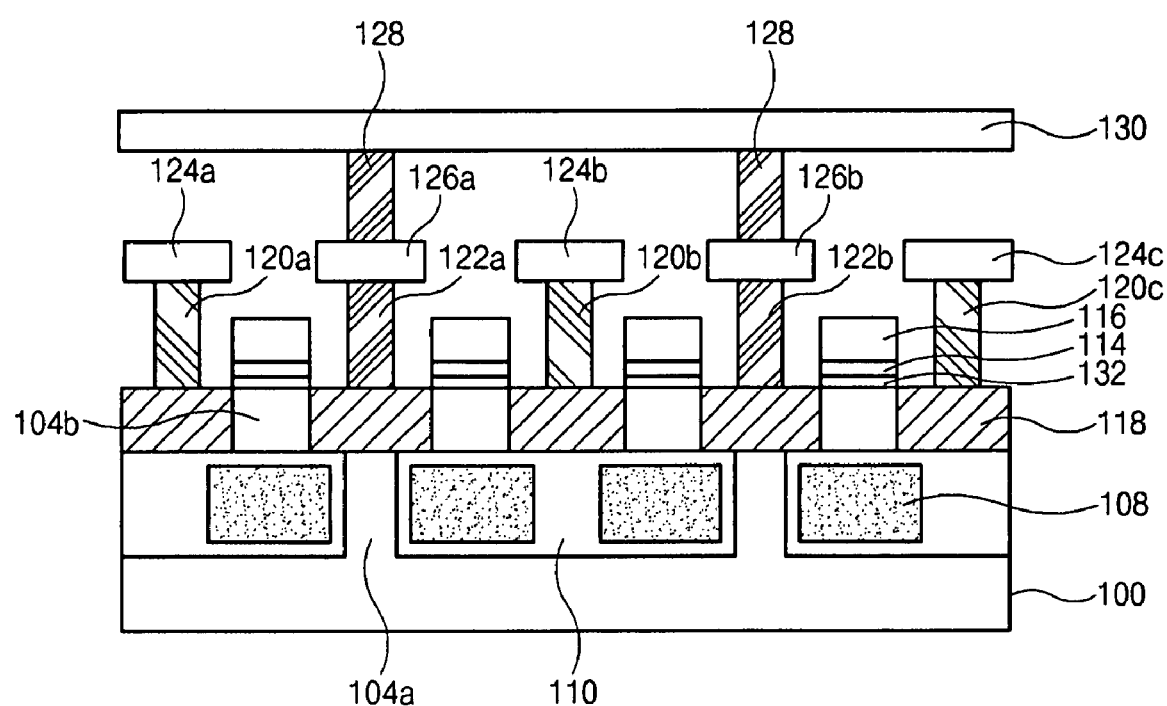
FIG. 16 is a cross-sectional diagram illustrating a nonvolatile ferroelectric memory device using a silicon substrate according to an embodiment consistent with the present invention.

FIG. 16 is a diagram illustrating a nonvolatile ferroelectric memory device using a silicon substrate according to an embodiment consistent with the present invention.

Figure 14:
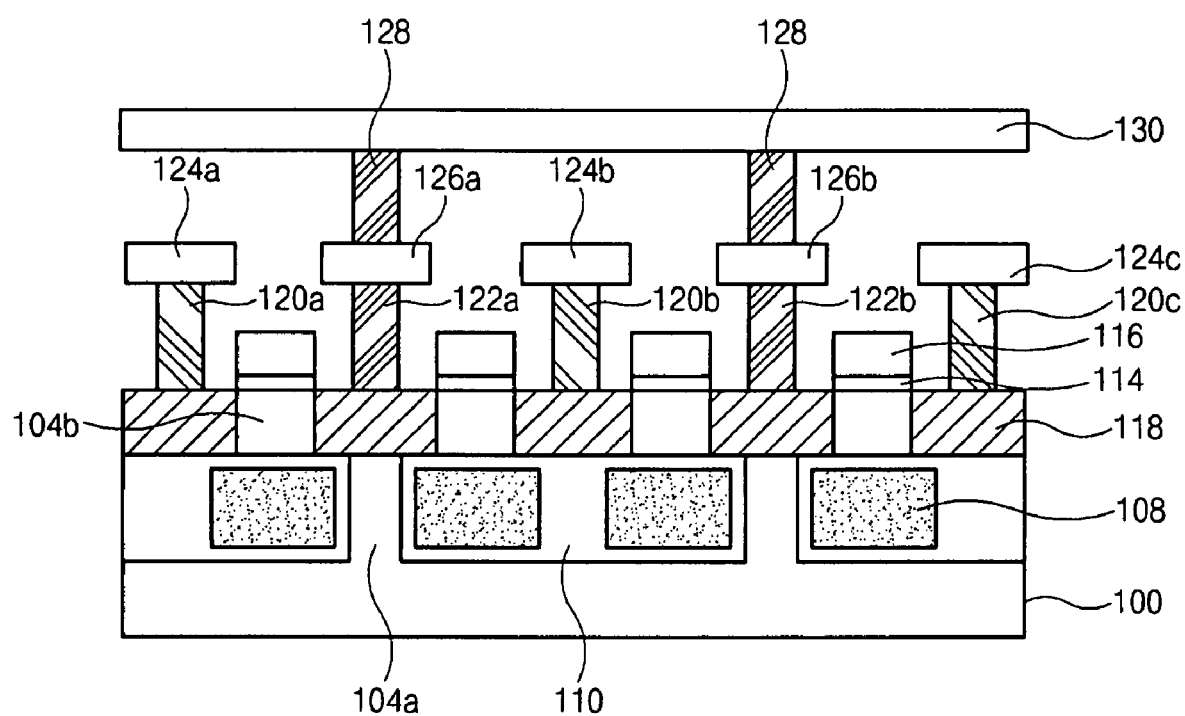

The nonvolatile ferroelectric memory device of FIG. 16 is different from that of FIG. 14 in that a buffer insulating layer 132 is formed between ferroelectric layer 114 and floating channel layer 104b. Buffer insulating layer 132 is formed in order to overcome difference in processes and materials of floating channel layer 104b and ferroelectric layer 114.

Figure 17:
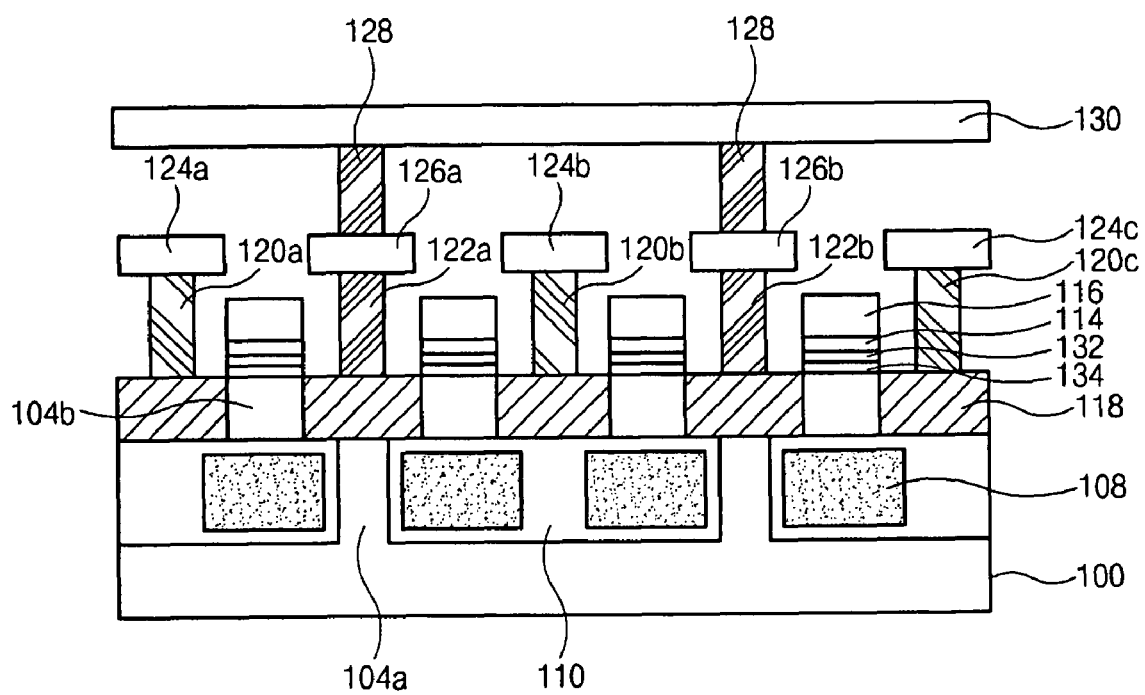
FIG. 17 is a cross-sectional diagram illustrating a nonvolatile ferroelectric memory device using a silicon substrate according to an embodiment consistent with the present invention.

FIG. 17 is a cross-sectional diagram illustrating a nonvolatile ferroelectric memory device using a silicon substrate according to an embodiment consistent with the present invention.

The nonvolatile ferroelectric memory device of FIG. 17 is different from that of FIG. 16 in that a floating conductive layer 134 is formed between buffer insulating layer 132 and floating channel layer 104b. Floating conductive layer 134 is formed in order to protect polarization charges so as to improve data retention characteristics. An insulating layer is formed between floating conductive layer 134 and floating channel layer 104b, and a buffer layer is formed for electric insulation.

Data of all cells of the selected row address are read, amplified and stored in a register. Since data "1" is written in all memory cells, it is not known which data are stored in the existing memory cell. As a result, data are stored in order to know which data are stored in the existing memory cell before the data "1" is written in the memory cell.

The data "1" is written in all cells of the selected row address. The data stored in the register are rewritten and restored in the memory cell so that new external data are written in new cells. As a result, the data "1" is preserved because the data "1" is previously written, and new data is written to data "0" stored in the memory cell.

Figure 18:
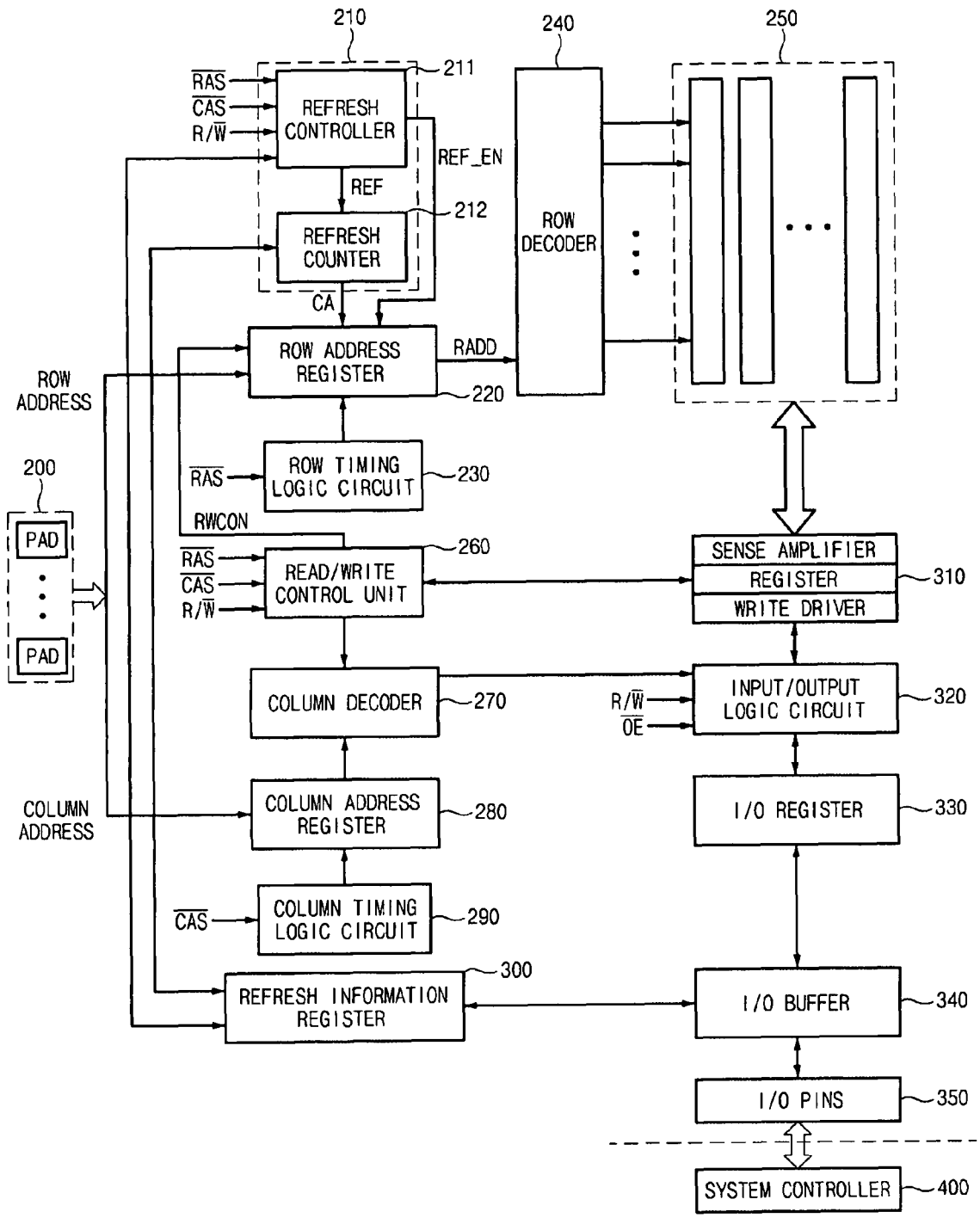
FIG. 18 is a diagram illustrating a nonvolatile ferroelectric memory device using a silicon substrate according to an embodiment consistent with the present invention.

FIG. 18 is a diagram illustrating a nonvolatile ferroelectric memory device using a silicon substrate according to an embodiment consistent with the present invention.

The nonvolatile ferroelectric memory device includes a pad array 200, a refresh control unit 210, a row address register 220, a row timing logic circuit 230, a row decoder 240, a cell array 250, a read/write control unit 260, a column decoder 270, a column address register 280, a column timing logic circuit 290, a refresh information register 300, a sense amplifier, register and write driver 310, an input/output logic circuit 320, an I/O register 330, an I/O buffer 340, and I/O pins 350.

Refresh control unit 210 includes a refresh controller 211 and a refresh counter 212. Cell array 250 includes a plurality of 1T-FET type unit cells of FIGS. 2 through 14.

Pad array 200 includes a plurality of pads PAD each of which may be configured to receive a row address and a column address so as to output the addresses with a time variance. Refresh controller 211 outputs a refresh signal REF and a refresh enable signal REF_EN for controlling a refresh operation in response to a RAS signal /RAS, a CAS signal /CAS, read/write commands R,/W, and a refresh control signal. Refresh counter 212 counts a refresh cycle in response to refresh signal REF applied from refresh controller 211 and the refresh control signal received from refresh information register 300 to output a count address CA. Refresh controller 211 and refresh counter 212 outputs refresh operation information and refresh count information to refresh information register 300

Row address register 220 may receive the row address received from pad array unit 200 and stores the address temporarily. Row address register 220 outputs row address RADD activated in response to an output signal from row timing logic circuit 230 and a read/write control signal RWCON received from read/write control unit 260 into row decoder 240. Row timing logic circuit 230 controls the storage operation and address output timing of row address register 220 in response to a RAS signal /RAS. Row decoder 240 decodes row address RADD applied from row address register 220 to output the address to cell array 250.

Read/write control unit 260 outputs a read/write control signal RWCON for controlling read/write operations into row address register 220 in response to a RAS signal /RAS, a CAS signal /CAS, and a read/write command R/W so as to control column decoder 270 and sense amplifier, register and write driver 310.

Column decoder 270 decodes the column address applied from column address register 280 depending on control of read/write control unit 260 to output the address to input/output logic circuit 320. Column address register 280 may temporarily store the column address received from pad array 200 so as to output the address into column decoder 270 depending on control of column timing logic circuit 290.

Column timing logic circuit 290 controls the storage operation and address output timing of column address register 280 in response to CAS signal /CAS. Register 310 outputs refresh data to the memory cell depending on control of column timing logic circuit 290 when refresh signal REF is activated.

Refresh information register 300 is a nonvolatile register configured to store parameters related to refresh operations. Refresh information register 300 stores refresh count information, power-off timing information of the system or internal memories and other parameter information so as to output a refresh control signal based on the parameter information in the refresh operations. In the power-off timing, information of refresh control unit 211 and refresh counter 212 is transmitted into refresh information register 300, and information related to external commands received from the I/O buffer 340 is stored. The information stored in refresh information register 300 through I/O buffer 340 and I/O pins 350 is outputted into a system controller 400.

Sense amplifier S/A senses and amplifies cell data to distinguish data "1" from data "0". Write driver W/D generates a driving voltage in response to write data when data are written in the memory cell to supply the driving voltage to the bit line. Register REG may temporarily store data sensed in sense amplifier S/A, and re-stores data in the memory cell in the write operation.

Input/output logic circuit 320 reads data stored in cell array 250 depending on an output signal from column decoder 270 and read/write commands R and /W, and stores data in cell array 250. Input/output logic circuit 320 includes a column selecting signal C/S, and outputs data stored in cell array 150 to data I/O register 330 in response to an output enable signal /OE.

I/O buffer 340 buffers read data stored in I/O register 330 to output the buffered data into I/O pins 350. I/O buffer 340 buffers write data received through I/O pins 350 to output the buffered data into I/O register 330. I/O buffer 340 outputs information stored in refresh information register 300 into system controller 400 through I/O pins 350. I/O pins 350 outputs data received from I/O buffer 340 into system controller 400 through data buses, or outputs data from system controller 400 through the data buses into I/O buffer 340.

Figure 19:
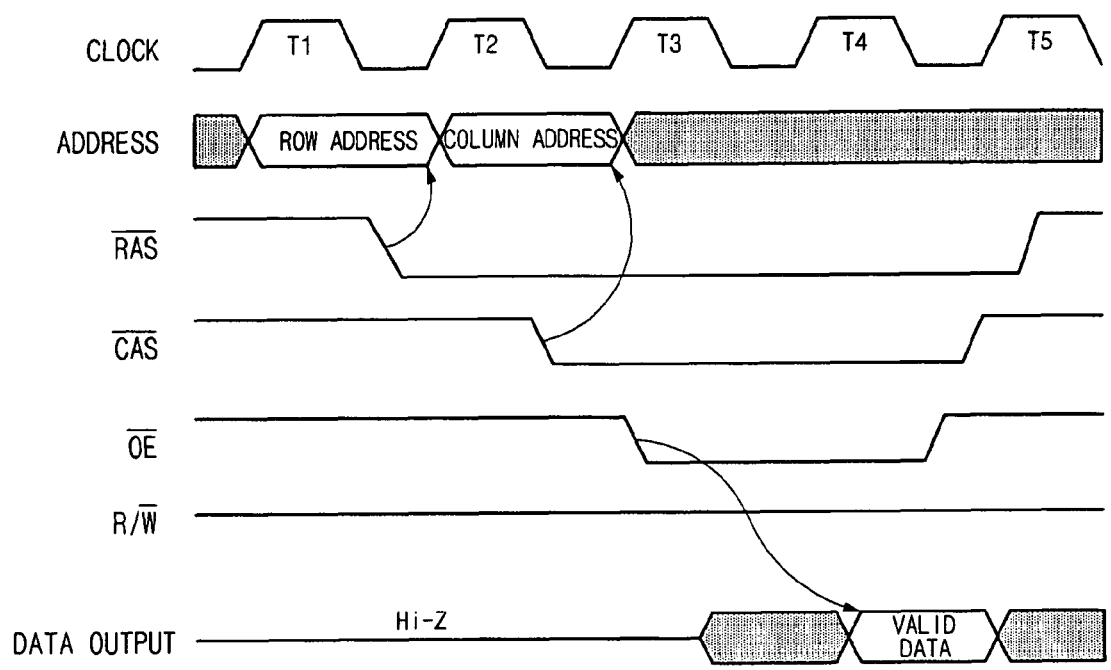
FIG. 19 is a timing diagram illustrating a read operation of a nonvolatile ferroelectric memory device using a silicon substrate according to an embodiment consistent with the present invention.
Figure 20:
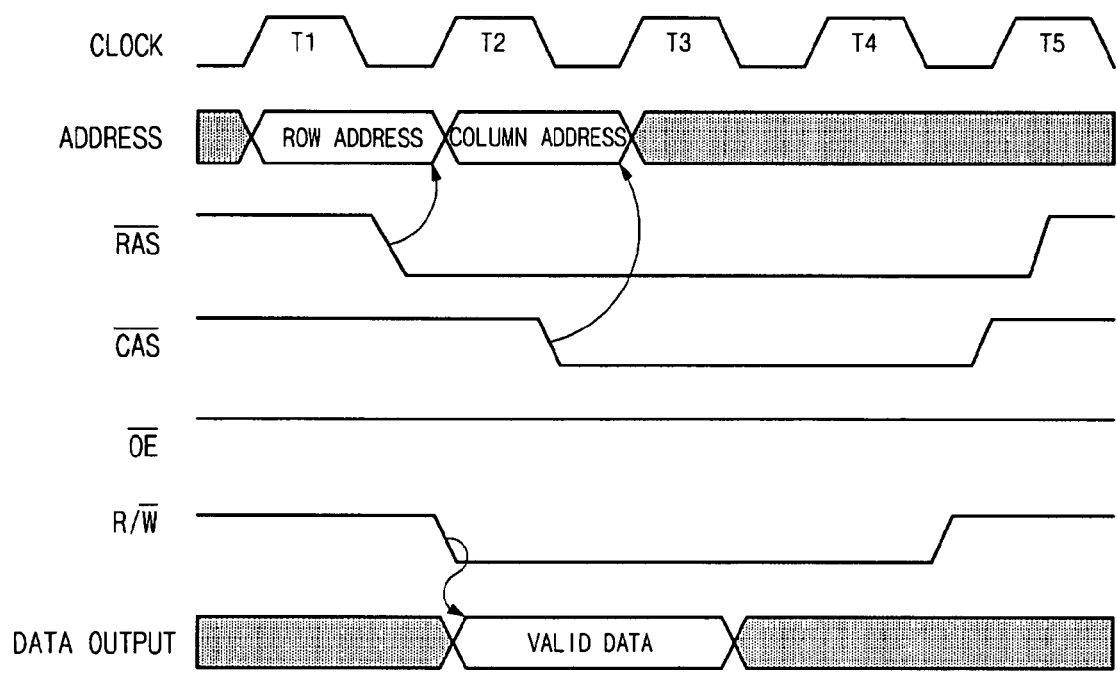
FIG. 20 is a timing diagram illustrating a write operation of a nonvolatile ferroelectric memory device using a silicon substrate according to an embodiment consistent with the present invention.

FIG. 19 is a timing diagram illustrating a read operation of a nonvolatile ferroelectric memory device using a silicon substrate according to an embodiment consistent with the present invention. FIG. 20 is a timing diagram illustrating a write operation of a nonvolatile ferroelectric memory device using a silicon substrate according to an embodiment consistent with the present invention.

Pad array 200 receives a row address and a column address through a plurality of pads PAD, and outputs the addresses to row address register 220 and column address register 280. Row address register 220 and column address register 280 output the row address and the column address with a given time difference depending on control of row timing logic circuit 230 and column timing logic circuit 290.

Row address register 220 stores the row address temporarily in synchronization with RAS signal /RAS, and outputs the row address to row decoder 240. When the row address is outputted, column address register 280 stores the column address temporarily.

Column address register 280 stores the column address temporarily in synchronization with CAS signal /CAS, and outputs the column address to column decoder 270. When the column address is outputted, row address register 220 stores the row address temporarily.

In the read mode, when output enable signal /OE is activated while read command R is activated, data stored in cell array 250 are outputted to the data buses depending on input/output logic circuit 320. On the other hand, in the write mode, when output enable signal /OE is inactivated while write command /W is activated, data is stored in cell array 250 depending on input/output logic circuit 320.

Refresh controller 211 outputs refresh signal REF for performing a refresh operation when a refresh operation command is applied. Refresh counter 212 counts a refresh cycle in response to refresh signal REF applied from refresh controller 211 to output a refresh address to row address register 220. The refresh address output from refresh counter 212 is stored in row address register 220. Column timing logic circuit 290 writes refresh data stored in register REG in cell array 250 in response to CAS signal /CAS.

Refresh signal REF may be a control signal using RAS signal /RAS and CAS signal /CAS. That is, when refresh signal REF is a control signal using RAS signal /RAS and CAS signal /CAS, the refresh operation is performed with a /CAS before /RAS system (/CBR).

In a normal mode, RAS signal /RAS is activated earlier than CAS signal /CAS so that a normal operation is performed depending on row timing logic circuit 230 and column timing logic circuit 290.

In a refresh mode, a signal sensing unit (not shown) senses when CAS signal /CAS is transited earlier than RAS signal /RAS so that refresh signal REF is activated. While a path of the normal operation mode is disconnected, the refresh operation is performed in response to the refresh address generated depending on refresh counter 212. When the simultaneous transition of CAS signal /CAS and RAS signal /RAS is sensed, the refresh signal REF is activated.

Although the refresh method using /CBR system is exemplified in the embodiment consistent with the present invention, the refresh operation may be performed by various methods with self-refresh, auto-refresh, or clock.

Figure 21:
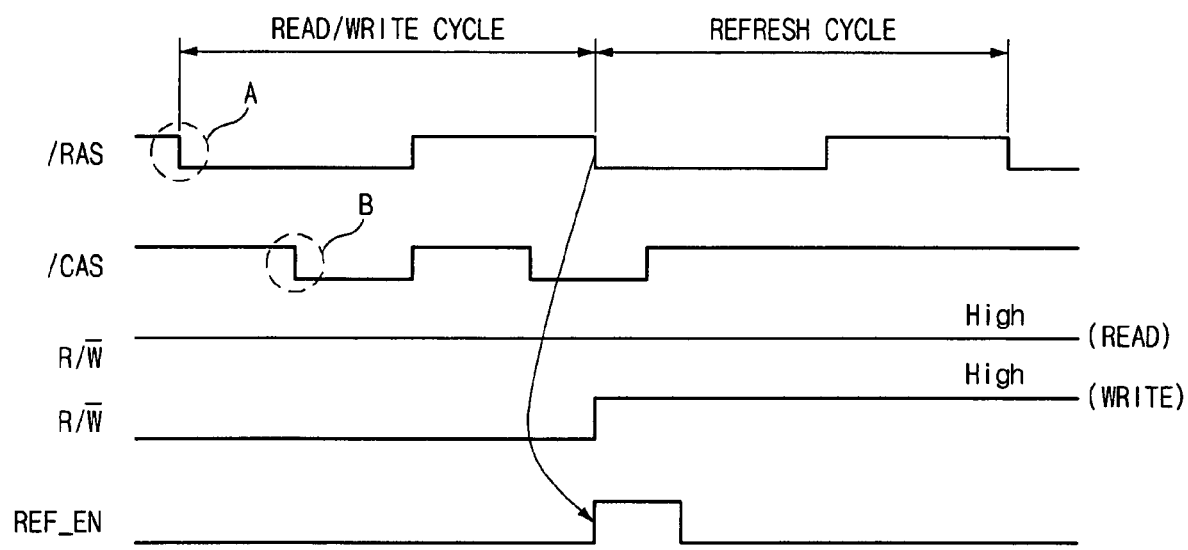
FIG. 21 is timing diagram illustrating a refresh method of a nonvolatile ferroelectric memory device using a silicon substrate according to an embodiment consistent with the present invention.

FIG. 21 is a timing diagram illustrating a refresh method of a nonvolatile ferroelectric memory device according to an embodiment consistent with the present invention.

Refresh controller 111 outputs refresh signal REF for performing a refresh operation into refresh counter 212, and outputs refresh enable signal REF_EN into row address register 220 in response to RAS signal /RAS, CAS signal /CAS, read/write commands R,/W, and the refresh control signal when a refresh operation command is applied. Refresh counter 212 counts a refresh cycle in response to refresh signal REF applied from refresh controller 211 and the refresh control signal to output count address CA to row address register 220.

Count address CA outputted from refresh counter 212 is stored in row address register 220. Column timing logic circuit 290 outputs data stored in column address register 280 into column decoder 270 in response to CAS signal /CAS. When sense amplifier S/A is activated, refresh data stored in register REG through input/output logic circuit 320 are written in cell array 250.

Refresh signal REF may be a control signal using RAS signal /RAS and CAS signal /CAS. That is, when refresh signal REF is a control signal using RAS signal /RAS and CAS signal /CAS, the refresh operation is performed with a /CAS before /RAS system (/CBR).

In the normal mode for performing read and write operations, RAS signal /RAS is activated earlier than CAS signal /CAS so that a normal operation is performed depending on row timing logic circuit 230 and column timing logic circuit 290. As shown in (A), when RAS signal /RAS is activated earlier, an external row address is activated so that sense amplifier S/A is activated. As shown in (B), when CAS signal /CAS is activated, an external column address is activated.

In the refresh mode, refresh controller 211 senses CAS signal /CAS transited earlier than RAS signal /RAS to activate refresh signal /REF. That is, when refresh controller 211 senses CAS signal /CAS transited earlier than RAS signal /RAS, refresh controller 211 decides the refresh mode to activate refresh enable signal REF_EN.

Row address register 220 performs a refresh operation in response to count address CA generated depending on refresh counter 212 while a path of the normal mode is disconnected when refresh enable signal REF_EN is activated. Row address register 220 may sense simultaneous transition of CAS signal /CAS and RAS signal /RAS to activate refresh signal REF.

Although the refresh method using /CBR system is exemplified in the embodiment consistent with the present invention, the refresh operation may be performed by various methods with self-refresh, auto-refresh, or clock.

In the refresh mode, a word line WL of cell array 250, which is an output signal of refresh counter 212, is selected depending on count address CA. As a result, data of the corresponding cell having a 1T structure in cell array 250 are sensed, amplified, and stored in sense amplifier register REG. New data are written in cell array 250, or the data stored in register REG are re-stored in cell array 250.

Figure 22:
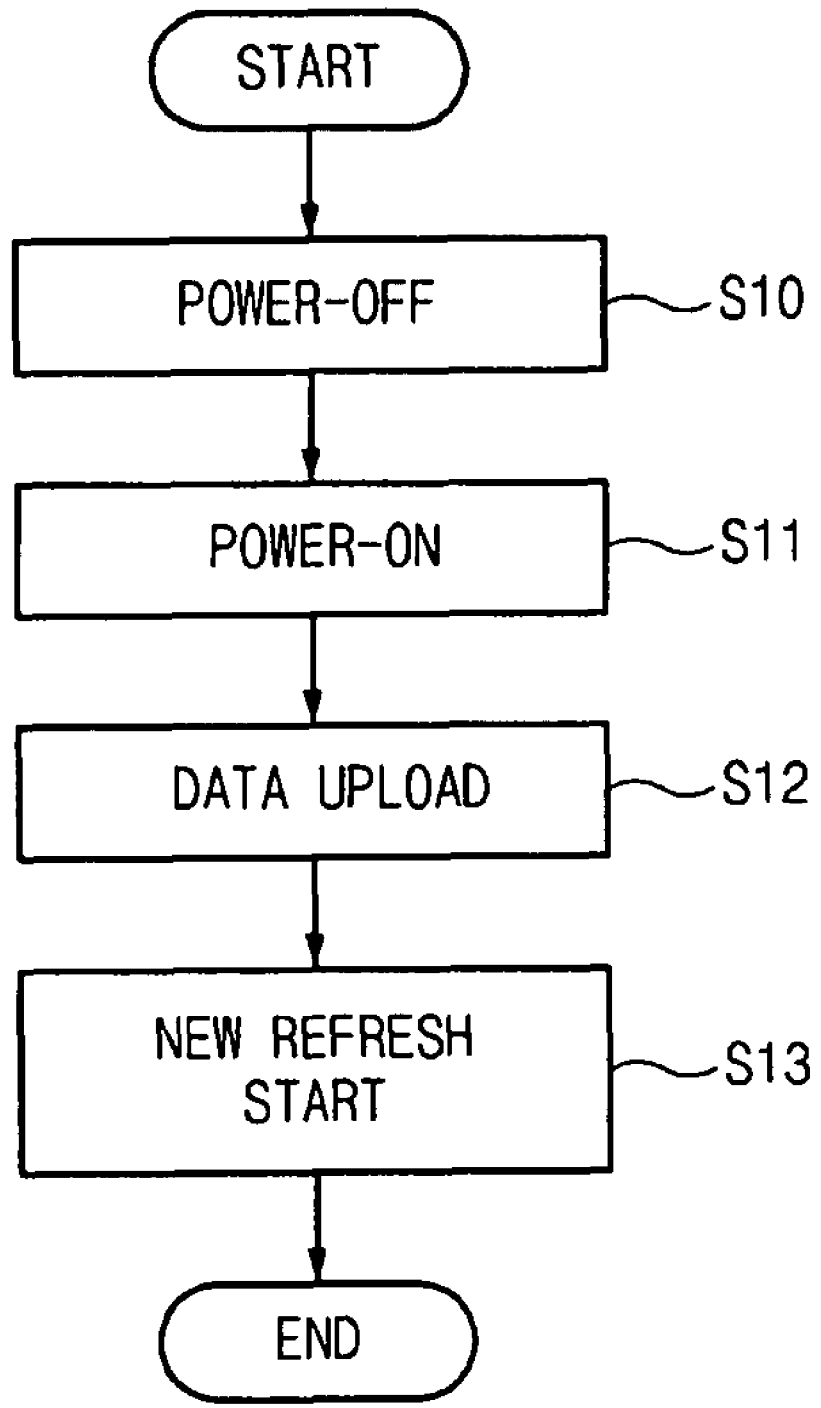
FIGS. 22 and 23 are flow charts illustrating a refresh method of a nonvolatile ferroelectric memory device using a silicon substrate according to an embodiment consistent with the present invention.
Figure 23:
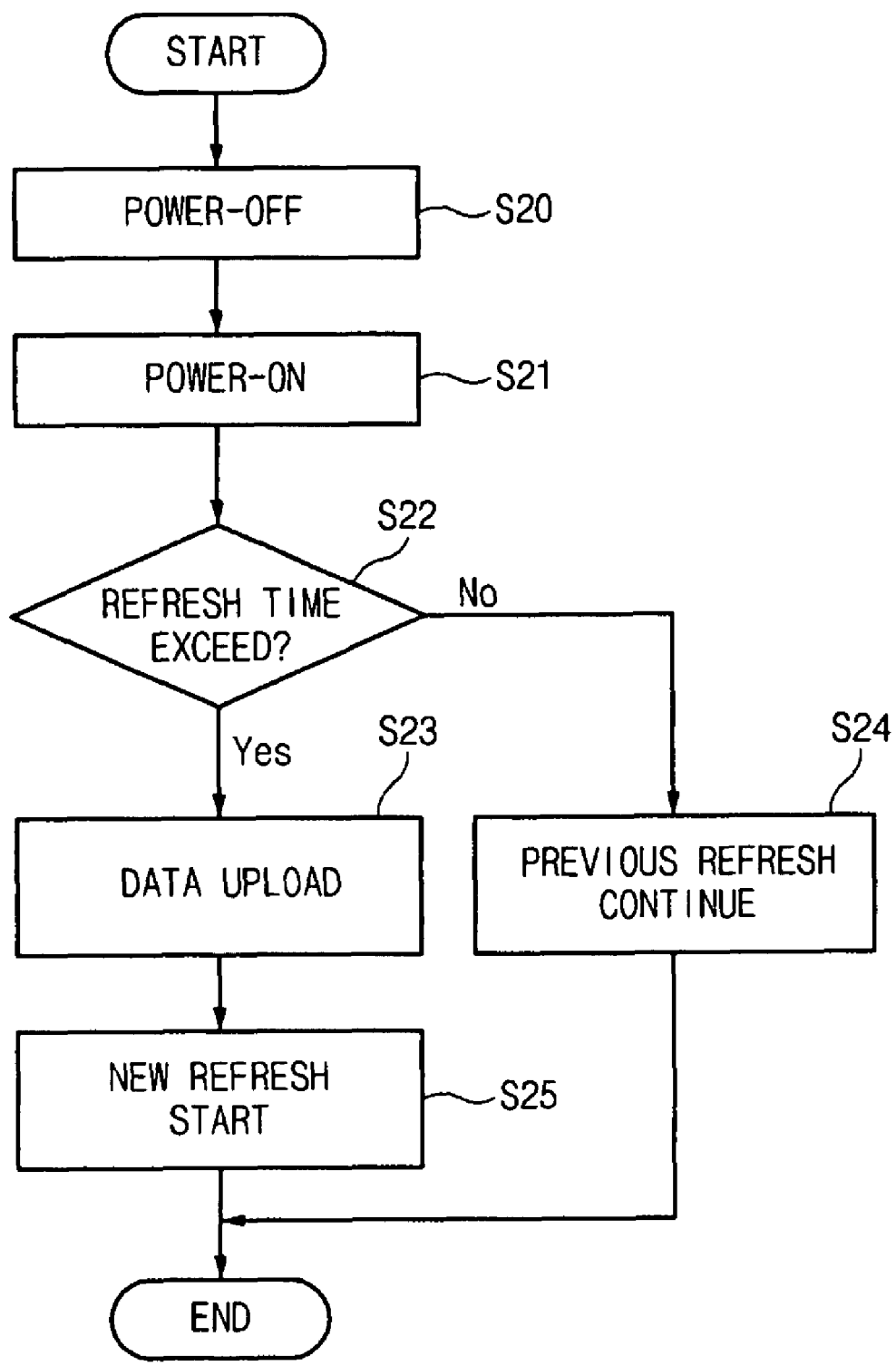

FIGS. 22 and 23 are flow charts illustrating a refresh method of a nonvolatile ferroelectric memory device according to an embodiment consistent with the present invention.

When the power is turned on (S11) while a system power of the DRAM, which is a volatile memory, is turned off (S10), data of the memory are uploaded (S12) so that a new refresh operation starts (S13). That is, when the system power is turned on, data of the memory are required to be uploaded.

However, in the nonvolatile ferroelectric memory device according to an embodiment consistent with the present invention, when the power is turned on (S21) while the system power is turned off (S20), refresh information register 300 decides whether the refresh time is exceeded (S22).

When the refresh time is exceeded, data of the memory are uploaded (S23) so that a new refresh operation starts (S25). On the other hand, when the refresh time is not exceeded, the refresh time is effective so that the previous refresh operation continues (S24).

Refresh information register 300 stores a parameter related to the refresh operation in a nonvolatile register. Refresh information register 300 stores refresh count information, power-off timing information of the system, or internal memories and other parameter information to be nonvolatile. In refresh information register 300, an additional power sensing unit (not shown) senses on/off states of the system or the internal memory.

When the power is off, data stored in refresh information register 300 are read to calculate the refresh passing time. The refresh passing time may be stored in a mode register set MRS and controlled in a system level.

The refresh passing time calculated in response to the refresh control signal is transmitted into refresh controller 211 in response to the refresh control signal. As a result, in one embodiment, it is unnecessary to upload the refresh related information even when the power is on.

Figure 24:
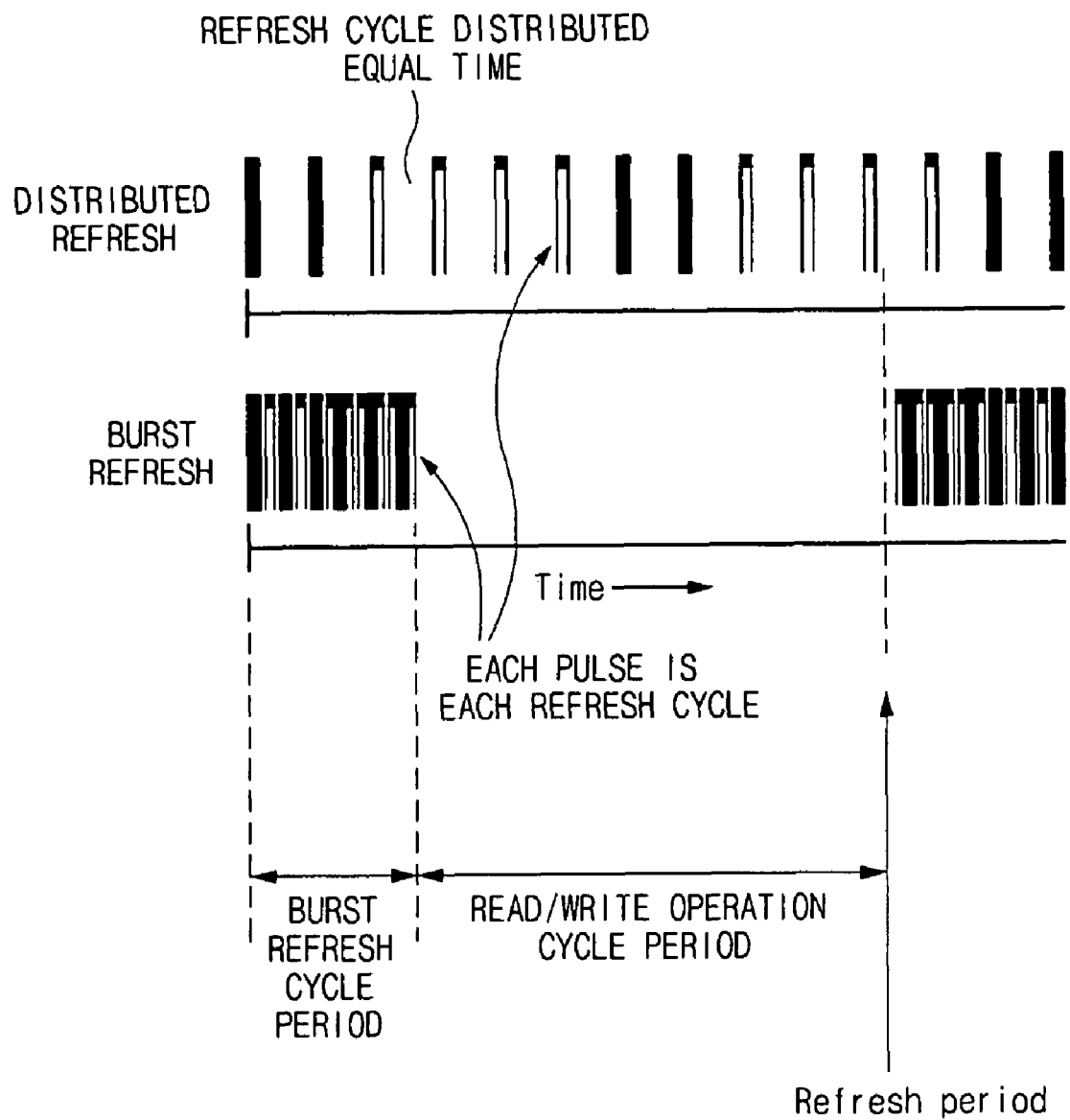
FIG. 24 is a diagram illustrating a refresh method of a nonvolatile ferroelectric memory device using a silicon substrate according to an embodiment consistent with the present invention.

FIG. 24 is a diagram illustrating a refresh method of a nonvolatile ferroelectric memory device according to an embodiment consistent with the present invention. The refresh method includes a distributed refresh method and a burst refresh method.

In the distributed refresh method, the refresh operation is performed with the same time distribution so that all cells may be refreshed within the refresh time in response to count address CA counted in refresh counter 212. That is, when 8 k rows are refreshed, each distributed refresh operation cycle is represented by (refresh time)/8 k. As a result, the cell becomes initialized only when data are written in all word lines WL.

In the burst refresh method, 8 k refresh cycles are continuously performed within a burst refresh cycle time. Each pulse means each refresh cycle, and a normal operation is performed in read/write operation cycle periods where the pulse is inactivated.

Figure 25:
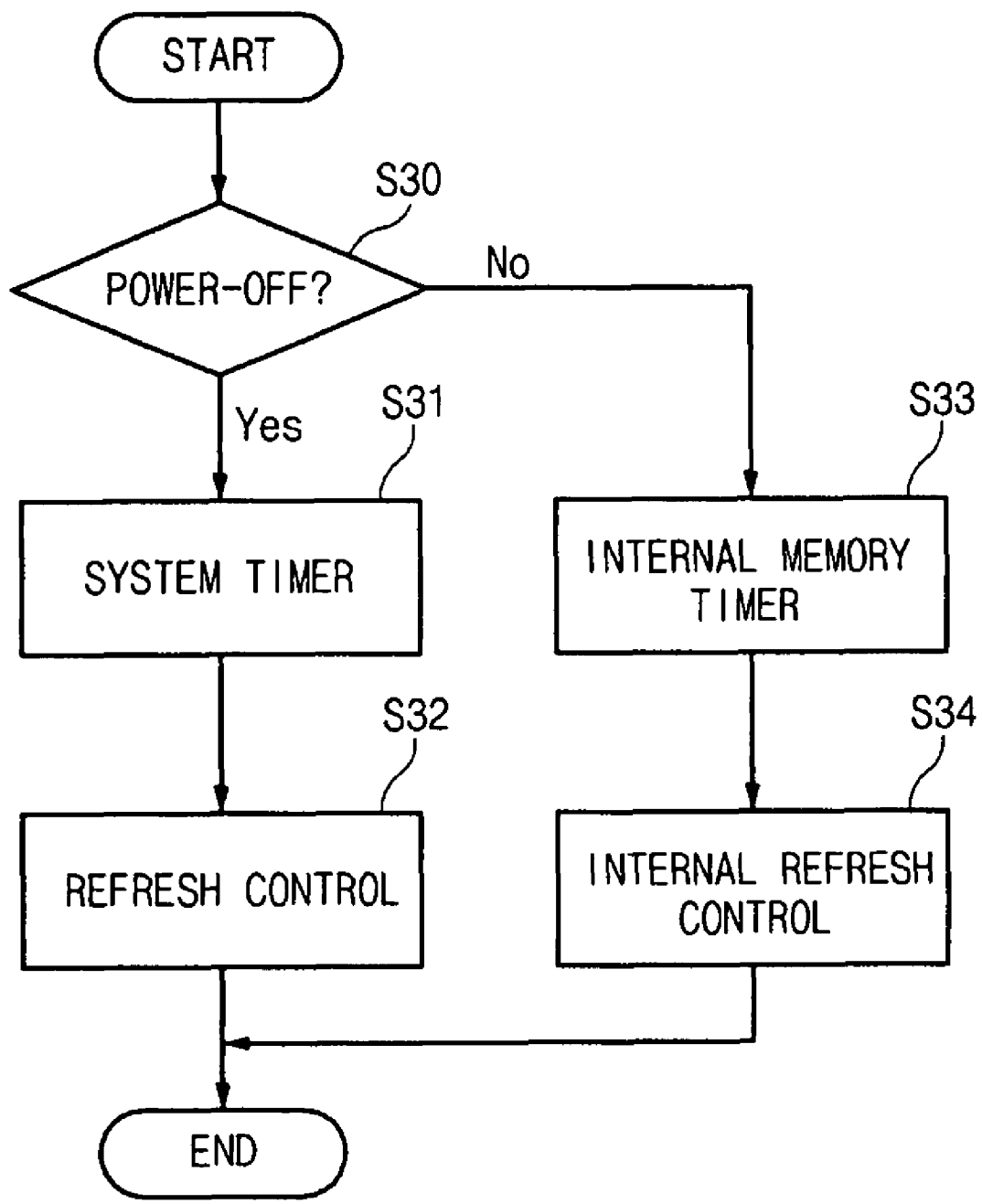
FIG. 25 is a diagram illustrating a timer control operation in the refresh method of a nonvolatile ferroelectric memory device using a silicon substrate according to an embodiment consistent with the present invention.

FIG. 25 is a diagram illustrating a timer control operation in the refresh method of a nonvolatile ferroelectric memory device according to an embodiment consistent with the present invention.

Refresh information register 300 identifies whether the system power is off, and stores the result (S30). When the power is off, a system timer in the system is used (S31) while an internal memory timer is off so that the refresh operation is controlled (S32). The system timer stores a date and a time with a battery while the power source is required to be on continuously.

On the other hand, when the power is not off, the internal memory timer operated individually is used (S33) so that the internal refresh operation is controlled (S34).

One of the external system timer or the internal memory timer is selected depending on on/off states of the power through input/output data pins 350. That is, the refresh information register of the memory device including the memory timer exchanges data with the data buses through I/O buffer 340 and I/O pins 350. The system CPU including the system timers exchanges data with the memory device through the data buses.

When the power is off through data exchange between the memory device and system controller 400, the refresh operation is performed with the external system timer whose power is continuously on. When the power is on, the refresh operation is performed with the internal memory timer.

As a result, the refresh period and the memory data are effectively maintained regardless of on/off state of the power of the memory chip. Between the refresh periods, the memory chip power is turned off to reduce power consumption, and a chip power is supplied only in the refresh period.

Figure 26:
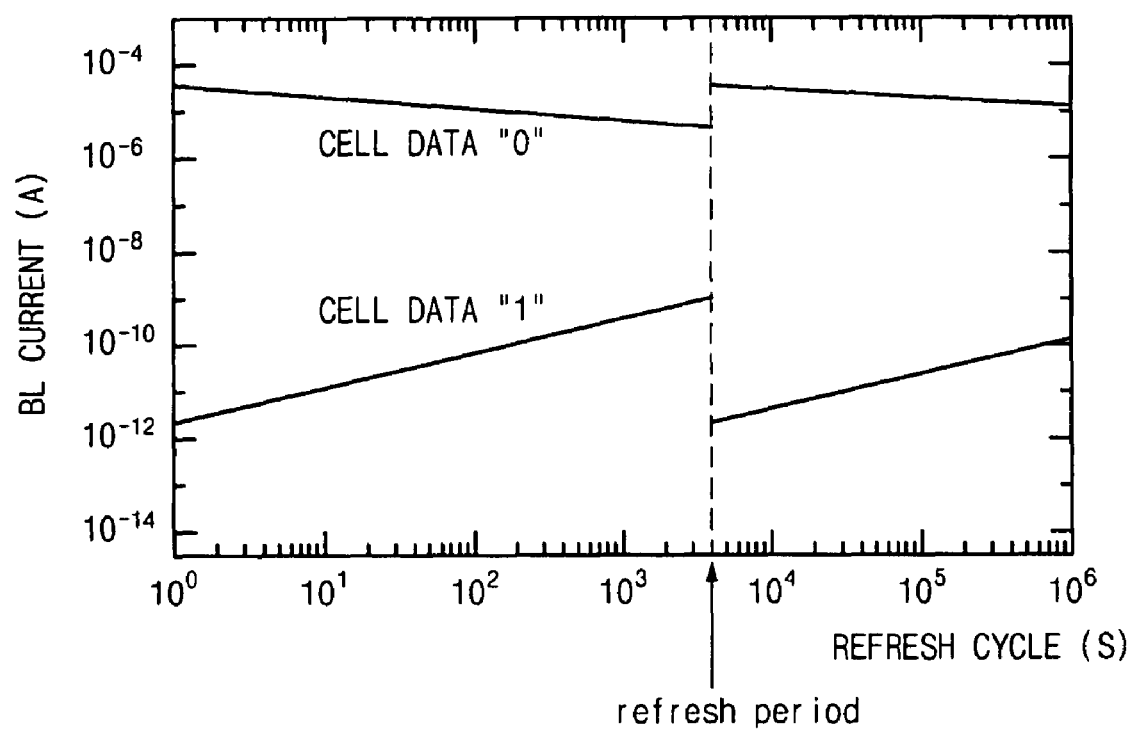
FIG. 26 is a graph illustrating a data retaining characteristic of a nonvolatile ferroelectric memory device according to an embodiment consistent with the present invention.

FIG. 26 is a graph illustrating data retention characteristics of a nonvolatile ferroelectric memory device according to an embodiment consistent with the present invention.

Although the 1T-FET type memory cell of the conventional FeRAM device has nonvolatile characteristics, cell data are degraded as time passes, thereby limiting data retention life. As a result, bit line BL current corresponding cell data "1" and "0" is reduced as time passes.

However, the refresh operation may be performed with a given cycle at a given timing when bit line BL current is reduced, thereby restoring cell data to improve data retention characteristics.

When the data retention characteristics of the memory cell are reduced to over a pre-set target value, a refresh circuit is driven to restore the cell data at the initial state. The degradation limit target time of the cell a refresh time so that all cells are operated within the refresh time.

The above-described FeRAM is operated due to its nonvolatile characteristic unlike the DRAM even when a power source is off. The on/off time of the power source is added and set as the whole data retention time so that the refresh operation is not frequently performed, thereby reducing power consumption and improving operation performance.

As described above, in a nonvolatile ferroelectric memory device according to an embodiment consistent with the present invention, a refresh operation is performed with a given cycle while data are preserved when a power source is off, so as to restore degraded cell data and improve data retention characteristics. Also, the nonvolatile ferroelectric memory device has the entire data retention time including the on/off time of the power source so that the refresh operation is not frequently performed, thereby reducing power consumption and improving operation performance.

The foregoing description of various embodiments consistent with the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile ferroelectric memory device comprising:
   a silicon substrate;
   an insulating layer formed in an etching region, the etching region being formed by etching a portion of the silicon substrate;
   a bottom word line, where two adjacent bottom word lines form a pair of bottom word lines and are enclosed within the insulating layer, the insulating layer having two ends, the two ends defined by a bulk connection silicon which provides electrical connection to the silicon substrate;
   a floating channel layer formed over the bottom word line;
   an impurity layer formed at both ends of the floating channel layer, the impurity layer including a source region and a drain region as a first source/drain region and a second source/drain region, where the first source/drain region is provided directly on a portion of the insulating layer formed between the pair of bottom word lines and the second source/drain region is provided directly on the bulk connection silicon;
   a ferroelectric layer formed over the floating channel layer;
   a word line formed over the ferroelectric layer; and
   a bit line formed above the word line.

2. The nonvolatile ferroelectric memory device according to claim 1, wherein the silicon substrate is P-type.

3. The nonvolatile ferroelectric memory device according to claim 1, wherein the drain region is connected to a bulk connection silicon region to expose a part of the silicon substrate.

4. The nonvolatile ferroelectric memory device according to claim 3, wherein the bulk connection silicon region is formed to have substantially the same height as that of the insulating layer.

5. The nonvolatile ferroelectric memory device according to claim 1, further comprising a sensing line contact and a bit line contact, the sensing line contact and the bit line contact being formed over the impurity layer and arranged alternately with the word line.

6. The nonvolatile ferroelectric memory device according to claim 1, wherein the bit line is formed over the drain region and at a top side of the silicon substrate where the insulating layer is not formed.

7. The nonvolatile ferroelectric memory device according to claim 1, further comprising a sensing line formed over the source region and at a top side of the insulating layer where the silicon substrate is not formed.

8. The nonvolatile ferroelectric memory device according to claim 1, wherein the impurity layer is an N+ layer.

9. The nonvolatile ferroelectric memory device according to claim 1, further comprising a buffer insulating layer formed between the floating channel layer and the ferroelectric layer.

10. The nonvolatile ferroelectric memory device according to claim 9, further comprising a floating conductive layer formed between the buffer insulating layer and the floating channel layer.

* * * * *